US011264432B2

(12) United States Patent
Choi et al.

(10) Patent No.: US 11,264,432 B2
(45) Date of Patent: Mar. 1, 2022

(54) DISPLAY DEVICE

(71) Applicant: SAMSUNG DISPLAY CO., LTD., Yongin-si (KR)

(72) Inventors: Junwon Choi, Yongin-si (KR); Yunkyeong In, Yongin-si (KR); Wonmi Hwang, Yongin-si (KR); Junyong An, Yongin-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 16/902,677

(22) Filed: Jun. 16, 2020

(65) Prior Publication Data

US 2020/0312924 A1   Oct. 1, 2020

Related U.S. Application Data

(63) Continuation of application No. 16/135,476, filed on Sep. 19, 2018, now Pat. No. 10,727,281, which is a
(Continued)

(30) Foreign Application Priority Data

Jun. 15, 2016   (KR) ................. 10-2016-0074732

(51) Int. Cl.
*H01L 29/08*   (2006.01)
*H01L 27/32*   (2006.01)
(Continued)

(52) U.S. Cl.
CPC ....... *H01L 27/3225* (2013.01); *G09G 3/3233* (2013.01); *G09G 3/3258* (2013.01);
(Continued)

(58) Field of Classification Search
CPC ............ H01L 27/3248; H01L 27/3258; H01L 27/3276; H01L 51/5206; H01L 51/5012
See application file for complete search history.

(56) References Cited

U.S. PATENT DOCUMENTS 7,122,384 B2   10/2006   Prober et al.
7,550,766 B2   6/2009    Ahn et al.
(Continued)

FOREIGN PATENT DOCUMENTS

CN   101924140 A   12/2010
CN   103872080 A   6/2014
(Continued)

OTHER PUBLICATIONS

Chinese Office Action for Application No. 201710441393.3 dated Jun. 2, 2021.

*Primary Examiner* — Phuc T Dang
(74) *Attorney, Agent, or Firm* — Cantor Colburn LLP

(57) ABSTRACT

A display device includes a scan line extending in a first direction, a data line and a driving voltage line extending in a second direction crossing the first direction, a switching thin film transistor ("TFT") connected to the scan line and the data line, a driving TFT connected to the switching TFT and including a driving semiconductor layer and a driving gate electrode, a storage capacitor connected to the driving TFT and including first and second storage capacitor plates, a node connection line between the data line and the driving voltage line and connected to the driving gate electrode, and a shielding portion between the data line and the node connection line.

23 Claims, 14 Drawing Sheets

Related U.S. Application Data continuation of application No. 15/597,763, filed on May 17, 2017, now Pat. No. 10,103,208.

(51) Int. Cl.
  *H01L 27/12* (2006.01)
  *G09G 3/3258* (2016.01)
  *G09G 3/3233* (2016.01)

(52) U.S. Cl.
  CPC ... *H01L 27/1255* (2013.01); *G09G 2300/043* (2013.01); *G09G 2300/0426* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2320/043* (2013.01); *H01L 27/3272* (2013.01); *H01L 27/3276* (2013.01)

(56) References Cited

U.S. PATENT DOCUMENTS

| | | | |
|---|---|---|---|
| 8,049,225 | B2 | 11/2011 | Yamazaki et al. |
| 9,257,493 | B2 | 2/2016 | Junghyun, et al. |
| 2003/0147018 | A1 | 8/2003 | Sano et al. |
| 2008/0055530 | A1 | 3/2008 | Fan Jiang et al. |
| 2009/0170230 | A1 | 7/2009 | Kidu et al. |
| 2010/0182303 | A1 | 7/2010 | Takasugi et al. |
| 2011/0109611 | A1* | 5/2011 | Nakamura ........... G09G 3/3225 345/211 |
| 2012/0001156 | A1 | 1/2012 | Cho et al. |
| 2014/0124751 | A1* | 5/2014 | Choi .................. H01L 27/3246 257/40 |
| 2014/0124754 | A1* | 5/2014 | Park ....................... G09G 3/32 257/40 |
| 2015/0001482 | A1 | 1/2015 | Jung |
| 2015/0187279 | A1* | 7/2015 | Lee ......................... H01L 51/56 257/40 |
| 2015/0364092 | A1 | 12/2015 | Kim |
| 2016/0064700 | A1* | 3/2016 | Pyon ...................... H01L 51/56 257/40 |
| 2016/0210905 | A1 | 7/2016 | Lee et al. |
| 2016/0307931 | A1 | 10/2016 | Hong et al. |
| 2016/0322448 | A1 | 11/2016 | Kim |
| 2016/0349565 | A1 | 12/2016 | Kim et al. |
| 2017/0084679 | A1* | 3/2017 | Jinta .................... H01L 27/3213 |
| 2017/0140706 | A1 | 5/2017 | Song et al. |

FOREIGN PATENT DOCUMENTS

| | | |
|---|---|---|
| JP | 2007233272 A | 9/2007 |
| JP | 201062548 A | 3/2010 |
| KR | 1020050073609 A | 7/2005 |
| KR | 101103615 B1 | 1/2012 |
| KR | 1020140077002 A | 6/2014 |
| KR | 1020150144893 A | 12/2015 |

* cited by examiner

DISPLAY DEVICE

This application is a continuation of U.S. patent application Ser. No. 16/135,476, filed on Sep. 19, 2018, now U.S. Pat. No. 10,727,281, which is a continuation of U.S. patent application Ser. No. 15/597,763, filed on May 17, 2017, now U.S. Pat. No. 10,103,203, which claims priority to Korean Patent Application No. 10-2016-0074732, filed on Jun. 15, 2016, and all the benefits accruing therefrom under 35 U.S.C. § 119, the content of which in its entirety is herein incorporated by reference.

BACKGROUND

1. Field

One or more exemplary embodiments relate to a display device.

2. Description of the Related Art

Generally, a display device includes a display element and electronic elements for controlling an electrical signal to be applied to the display element. The electronic elements include a thin film transistor ("TFT"), a storage capacitor, and a plurality of wirings.

To accurately control an emission and an emission degree of a display element, a number of TFTs electrically connected to one display element has increased and a number of the plurality of wirings transferring an electrical signal to the TFTs has also increased.

SUMMARY

According to a display device of the related art, as intervals between elements of a thin film transistor ("TFT") and/or wirings of a display device are reduced so as to implement a miniaturized or high resolution display device, disadvantages such as parasitic capacitance of a driving TFT have increased.

One or more exemplary embodiments include a display device which prevents occurrence of parasitic capacitance and reduces occurrence of an off-current. However, the above embodiment is merely provided as an example, and the scope of the invention is not limited thereto.

Additional exemplary embodiments will be set forth in part in the description which follows and, in part, will be apparent from the description, or may be learned by practice of the presented exemplary embodiments.

According to one or more exemplary embodiments, a display device includes a first scan line extending in a first direction, a data line and a driving voltage line each extending in a second direction crossing the first direction, a switching TFT connected to the first scan line and the data line, a driving TFT connected to the switching TFT and including a driving semiconductor layer and a driving gate electrode, a storage capacitor connected to the driving TFT and including first and second storage capacitor plates, a node connection line connected to the driving gate electrode and arranged between the data line and the driving voltage line, and a shielding portion arranged between the data line and the node connection line.

In an exemplary embodiment, the display device may further include a compensation TFT including a compensation semiconductor layer and a compensation gate electrode, where the compensation TFT turns on in response to a scan signal of the first scan line and diode-connects the driving TFT.

In an exemplary embodiment, one side of the node connection line may be connected to the compensation semiconductor layer.

In an exemplary embodiment, the driving voltage line may cover at least a portion of the compensation TFT.

In an exemplary embodiment, the shielding portion may extend in the second direction.

In an exemplary embodiment, the display device may further include an initialization voltage line providing an initialization voltage, and the shielding portion may be electrically connected to the initialization voltage line.

In an exemplary embodiment, the shielding portion may include at least one of a shielding semiconductor layer including a same material as that of the driving semiconductor layer, and a metallic shielding layer including a metallic material.

In an exemplary embodiment, the display device may further include a second scan line extending in the first direction and crossing the shielding portion.

In an exemplary embodiment, the shielding semiconductor layer may include a first shielding region and a second shielding region spaced apart from each other in the second direction with the second scan line therebetween.

In an exemplary embodiment, the first shielding region may be electrically connected to the second shielding region by a conductive layer.

In an exemplary embodiment, the conductive layer may be the metallic shielding layer.

In an exemplary embodiment, the shielding semiconductor layer may include polycrystalline silicon.

In an exemplary embodiment, the metallic shielding layer may include a same material as that of at least one of the data line, the node connection line, and the second storage capacitor plate.

In an exemplary embodiment, the driving gate electrode and the first storage capacitor plate may include a same material.

In an exemplary embodiment, the display device may further include an organic light-emitting diode electrically connected to the driving TFT.

A display device according to exemplary embodiments may prevent occurrence of parasitic capacitance and provide a high quality image by reducing an off-current. The scope of the invention is not limited by this effect.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

Figure 1:
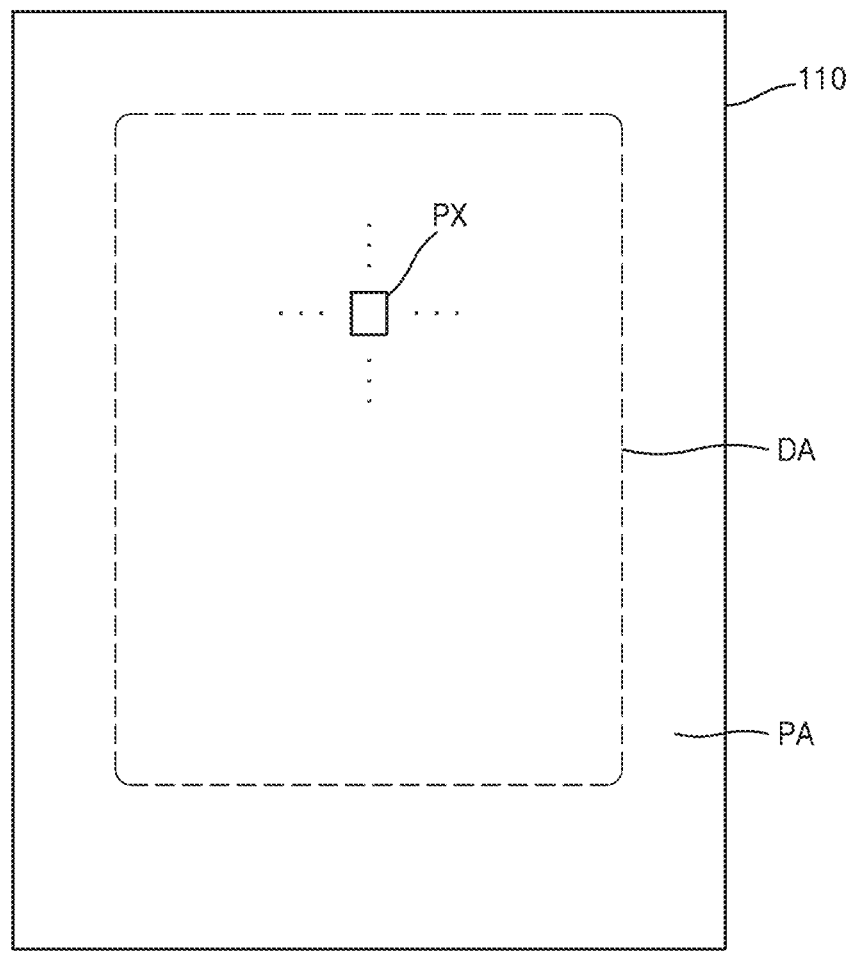
FIG. 1 is a plan view of an exemplary embodiment of a display device.

As the disclosure allows for various changes and numerous exemplary embodiments, exemplary embodiments will be illustrated in the drawings and described in detail in the written description. An effect and a characteristic of the disclosure, and a method of accomplishing these will be apparent when referring to exemplary embodiments described with reference to the drawings. This disclosure may, however, be embodied in many different forms and should not be construed as limited to the exemplary embodiments set forth herein.

Hereinafter, the disclosure will be described more fully with reference to the accompanying drawings, in which exemplary embodiments of the disclosure are shown. When description is made with reference to the drawings, like reference numerals in the drawings denote like or corresponding elements, and repeated description thereof will be omitted.

As used herein, the term "and/or" includes any and all combinations of one or more of the associated listed items.

Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to FIG. 1 is a plan view of a display device according to an exemplary embodiment.

Referring to FIG. 1, the display device includes a substrate 110. The substrate 110 includes a display area DA displaying an image and a peripheral area PA around the display area DA. The peripheral area PA does not display an image, and thus the peripheral area PA may correspond to a dead area.

Pixels PX having various display elements such as organic light-emitting diodes ("OLEDs") may be in the display area DA of the substrate 110. Various wirings transferring electrical signals to be applied to the display area DA may be in the peripheral area PA of the substrate 110. Hereinafter, for convenience of description, a display device having an OLED as a display element is described. However, the invention is not limited thereto.

Figure 2:
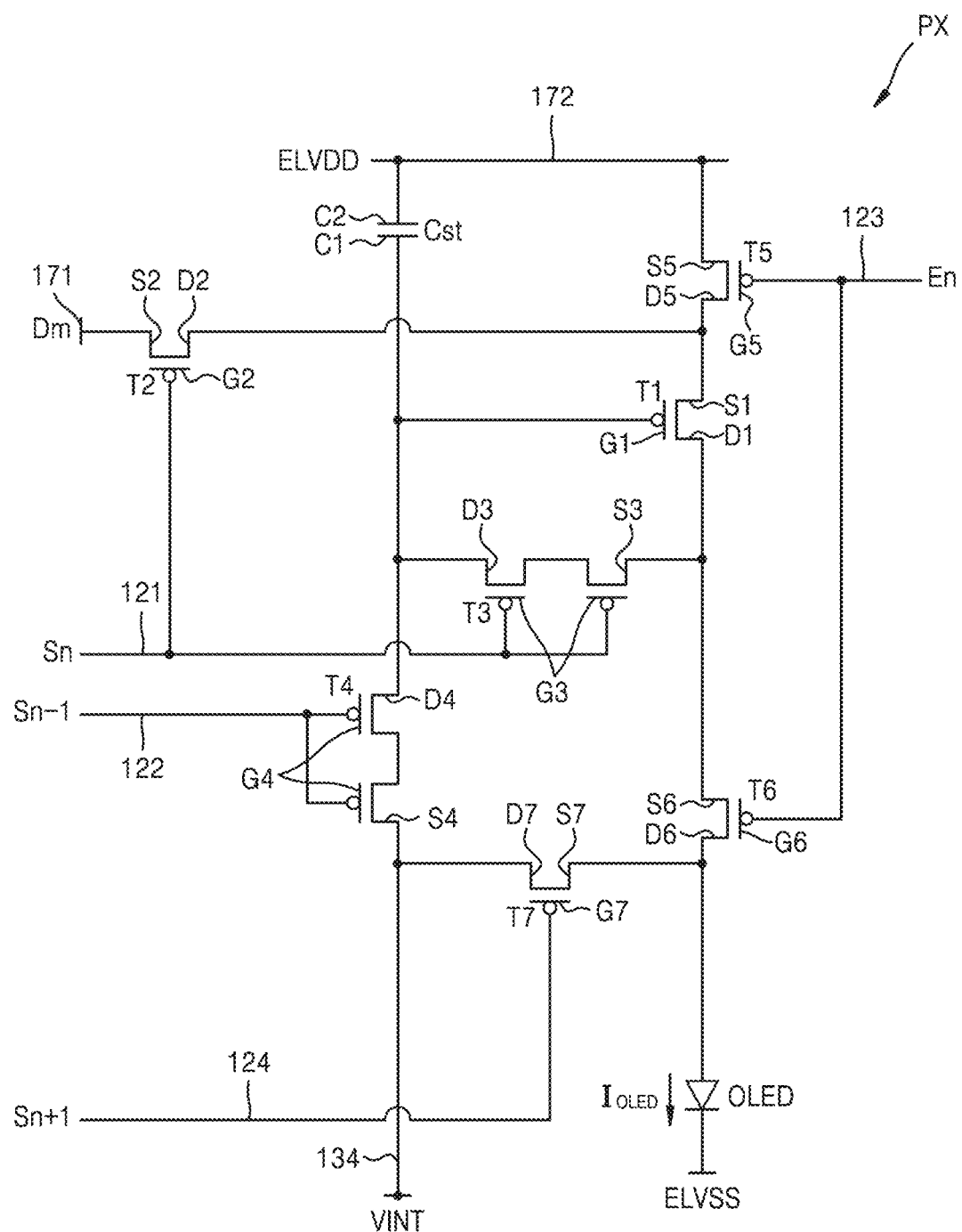
FIG. 2 is an equivalent circuit diagram of an exemplary embodiment of one pixel of the display device of FIG. 1.

FIG. 2 is an equivalent circuit diagram of one pixel PX of the display device of FIG. 1, according to an exemplary embodiment.

Referring to FIG. 2, a pixel PX includes signal lines 121, 122, 123, 124, and 171, a plurality of thin film transistors ("TFTs") T1, T2, T3, T4, T5, T6, and T7 connected to the signal lines, a storage capacitor Cst, an initialization voltage line 134, a driving voltage line 172, and an OLED.

Although FIG. 2 illustrates that each pixel includes the signal lines 121, 122, 123, 124, and 171, the initialization voltage line 134, and the driving voltage line 172, the invention is not limited thereto. In another exemplary embodiment, at least one of the signal lines 121, 122, 123, 124, and 171 and/or the initialization voltage line 134 may be shared by adjacent pixels.

The TFTs may include a driving TFT T1, a switching TFT T2, a compensation TFT T3, a first initialization TFT T4, an operation control TFT T5, an emission control TFT T6, and a second initialization TFT T7.

The signal lines include the scan line 121 transferring a scan signal Sn to the switching TFT T2 and the compensation TFT T3, the previous scan line 122 and the next scan line 124 respectively transferring a previous scan signal Sn−1 and a next scan signal Sn+1 to the first initialization TFT T4 and the second initialization TFT T7, the emission control line 123 transferring an emission control signal En to the operation control TFT T5 and the emission control TFT T6, and the data line 171 crossing the scan line 121 and transferring a data signal Dm. The driving voltage line 172 transfers a driving voltage ELVDD to the driving TFT T1, and the initialization voltage line 134 transfers an initialization voltage VINT which initializes the driving TFT T1 and a pixel electrode.

A driving gate electrode G1 of the driving TFT T1 is connected to a first storage capacitor plate C1 of the storage capacitor Cst, a driving source electrode S1 of the driving TFT T1 is connected to the driving voltage line 172 via the operation control TFT T5, and a driving drain electrode D1 of the driving TFT T1 is electrically connected to the pixel electrode of the OLED via an emission control TFT T6. The driving TFT T1 receives a data signal Dm and supplies a driving current $I_{OLED}$ to the OLED in response to a switching operation of the switching TFT T2.

A switching gate electrode G2 of the switching TFT T2 is connected to the scan line 121, a switching source electrode S2 of the switching TFT T2 is connected to a data line 171, and a switching drain electrode D2 of the switching TFT T2 is connected to the driving source electrode S1 of the driving TFT T1 and simultaneously connected to the driving voltage line 172 via the operation control TFT T5. The switching TFT T2 is turned on and performs a switching operation of transferring a data signal Dm received via the data line 171 to the driving source electrode S1 of the driving TFT T1 in response to a scan signal Sn received via the scan line 121.

A compensation gate electrode G3 of the compensation TFT T3 is connected to the scan line 121, a compensation source electrode S3 of the compensation TFT T3 is connected to the driving drain electrode D1 of the driving TFT T1 and simultaneously connected to the pixel electrode of the OLED via the emission control TFT T6, and a compensation drain electrode D3 of the compensation TFT T3 is simultaneously connected to the first storage capacitor plate C1 of the first storage capacitor Cst, a first initialization drain electrode D4 of the first initialization TFT T4, and the driving gate electrode G1 of the driving TFT T1. The compensation TFT T3 is turned on and diode-connects the driving TFT T1 by electrically connecting the driving gate electrode G1 to the driving drain electrode D1 of the driving TFT T1 in response to a scan signal Sn received via the scan line 121.

A first initialization gate electrode G4 of the first initialization TFT T4 is connected to the previous scan line 122, a first initialization source electrode S4 of the first initialization TFT T4 is connected to a second initialization drain electrode D7 of the second initialization TFT T7 and the initialization voltage line 134, and the first initialization drain electrode D4 of the first initialization TFT T4 is connected to the first storage capacitor plate C1 of the storage capacitor Cst, the compensation drain electrode D3 of the compensation TFT T3, and the driving gate electrode G1 of the driving TFT T1. The first initialization TFT T4 is turned on and performs an initialization operation of initializing the voltage of the driving gate electrode G1 of the driving TFT T1 by transferring the initialization voltage VINT to the driving gate electrode G1 of the driving TFT T1 in response to a previous scan signal Sn−1 received via the previous scan line 122.

The operation control gate electrode G5 of the operation control TFT T5 is connected to the emission control line 123, an operation control source electrode S5 of the operation control TFT T5 is connected to the driving voltage line 172, and an operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line 123, an emission control source electrode S6 of the emission control TFT T6 is connected to the driving drain electrode D1 of the driving TFT T1 and the compensation source electrode S3 of the compensation TFT T3, and an emission control drain electrode D6 of the emission control TFT T6 is electrically connected to the second initialization source electrode S7 of the second initialization TFT T7 and the pixel electrode of the OLED.

The operation control TFT T5 and the emission control TFT T6 are simultaneously turned on in response to an emission control signal En received via the emission control line 123, and the driving voltage ELVDD is transferred to the OLED so that the driving current $I_{OLED}$ flows through the OLED.

A second initialization gate electrode G7 of the second initialization TFT T7 is connected to the next scan line 124, a second initialization source electrode S7 of the second initialization TFT T7 is connected to the emission control drain electrode D6 of the emission control TFT T6 and the pixel electrode of the OLED, and a second initialization drain electrode D7 of the second initialization TFT T7 is connected to the first initialization source electrode S4 of the first initialization TFT T4 and the initialization voltage line 134. The second initialization TFT T7 is turned on and initializes the pixel electrode of the OLED in response to a next scan signal Sn+1 received via the next scan line 124.

Although FIG. 2 illustrates that the first initialization TFT T4 and the second initialization TFT T7 are respectively connected to the previous scan line 122 and the next scan line 124, the invention is not limited thereto. In another exemplary embodiment, both the first initialization TFT T4 and the second initialization TFT T7 may be connected to the previous scan line 122.

A second storage capacitor plate C2 of the storage capacitor Cst is connected to the driving voltage line 172, and an opposite electrode of the OLED is connected to a common voltage ELVSS. Therefore, the OLED may display an image by receiving the driving current $I_{OLED}$ from the driving TFT T1 and emitting light.

Although FIG. 2 illustrates that the compensation TFT T3 and the first initialization TFT T4 have dual gate electrodes, the invention is not limited thereto. In an exemplary embodiment, the compensation TFT T3 and the first initialization TFT T4 may have one gate electrode, for example. Also, at least one of the TFTs T1, T2, T5, T6, and T7 in addition to the compensation TFT T3 and the first initialization TFT T4 may have dual gate electrodes. Various modifications may be made thereto.

An operation of each pixel PX according to an exemplary embodiment is described below.

During an initialization period, when a previous scan signal Sn−1 is supplied via the previous scan line 122, the first initialization TFT T4 is turned on in response to the previous scan signal Sn−1, and the driving TFT T1 is initialized by the initialization voltage VINT supplied via the initialization voltage line 124.

During a data programming period, when a scan signal Sn is supplied via the scan line 121, the switching TFT T2 and the compensation TFT T3 are turned on in response to the scan signal Sn. In this case, the driving TFT T1 is diode-connected and forward-biased by the compensation TFT T3 which has been turned on.

Then, a compensation voltage Dm+Vth (Vth has a (−) value), which has been reduced by a threshold voltage Vth of the driving TFT T1 from a data signal Dm supplied via the data line 171, is applied to the driving gate electrode of the driving TFT T1. The driving voltage ELVDD and the compensation voltage Dm+Vth are applied to both ends of the storage capacitor Cst, and a charge corresponding to a voltage difference between both ends is stored in the storage capacitor Cst.

During an emission period, the operation control TFT T5 and the emission control TFT T6 are turned on in response to an emission control signal En supplied via the emission control line 123. The driving current $I_{OLED}$ corresponding to a voltage difference between a voltage of the gate electrode G1 of the driving TFT T1 and the driving voltage ELVDD occurs, and the driving current $I_{OLED}$ is supplied to the OLED via the emission control TFT T6.

Hereinafter, the structure of the pixel illustrated in FIG. 2 is described with reference to FIGS. 3 to 9.

Figure 3:
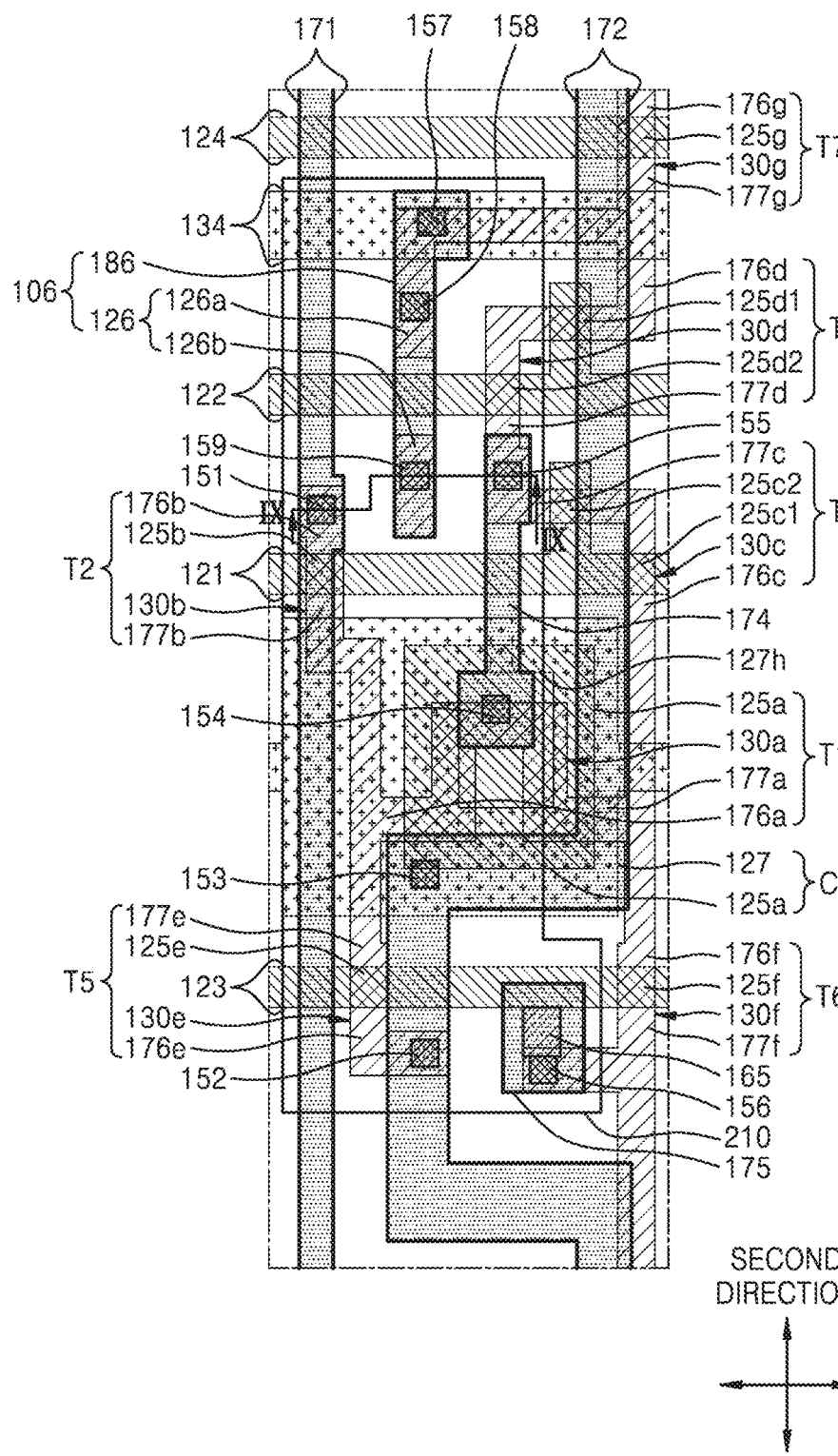
FIG. 3 is a plan view of the locations of a plurality of thin film transistors ("TFTs"), a storage capacitor, and a pixel electrode of the pixel in FIG. 2.
Figure 7:
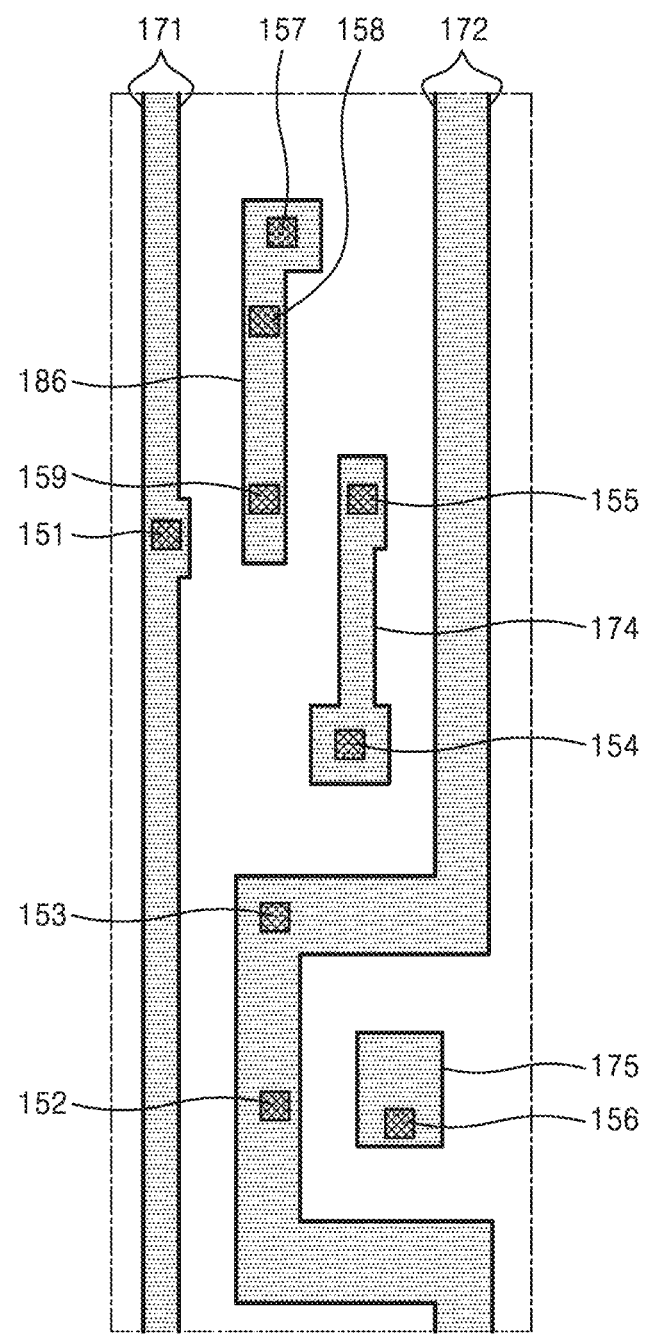
Figure 8:
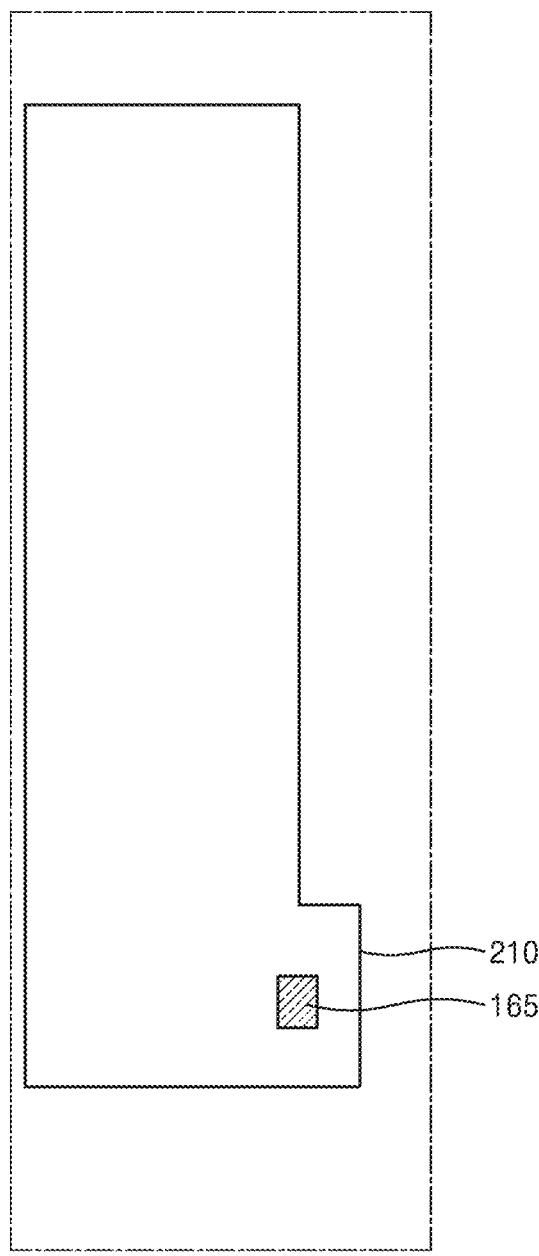
Figure 9:
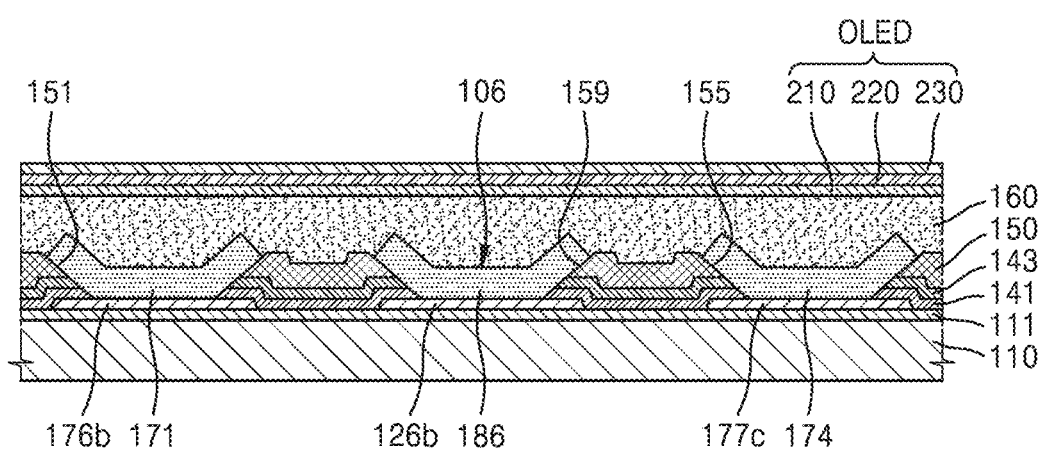
FIG. 9 is a cross-sectional view of the plurality of TFTs, the storage capacitor, and the pixel electrode taken along line IX-IX of FIG. 3.

FIG. 3 is a plan view of locations of a plurality of TFTs, a storage capacitor, and a pixel electrode of the pixel PX of FIG. 2, FIGS. 4 to 8 are plan views illustrating elements such as the plurality of TFTs, the storage capacitor, and the pixel electrode of FIG. 3 on a layer basis, and FIG. 9 is a cross-sectional view of the plurality of TFTs, the storage capacitor, and the pixel electrode taken along line IX-IX of FIG. 3.

FIGS. 4 to 8 illustrate the arrangements of a wiring, an electrode, and a semiconductor layer with each of FIGS. 4 to 8 showing one layer, and an insulating layer may be between the layers illustrated in FIGS. 4 to 8. In an exemplary embodiment, a first gate insulating layer 141 (refer to FIG. 9) is between the layer illustrated in FIG. 4 and the layer illustrated in FIG. 5, a second gate insulating layer 143 (refer to FIG. 9) is between the layer illustrated in FIG. 5 and the layer illustrated in FIG. 6, an interlayer insulating layer 150 (refer to FIG. 9) is between the layer illustrated in FIG. 6 and the layer illustrated in FIG. 7, and a planarization insulating layer 160 (refer to FIG. 9) is between the layer illustrated in FIG. 7 and the layer illustrated in FIG. 8, for example. The layers illustrated in FIGS. 4 to 8 may be electrically connected to each other via a contact hole defined in at least one of the above-mentioned insulating layers.

Referring to FIG. 3, a pixel PX includes the scan line 121, the previous scan line 122, the emission control line 123, the next scan line 124, and the initialization voltage line 134, each extending in a first direction (e.g., an x-direction) and respectively applying a scan signal Sn, a previous scan signal Sn−1, an emission control signal En, a next scan signal Sn+1, and the initialization voltage VINT (refer to FIG. 2). Also, the pixel PX may include the data line 171 and the driving voltage line 172 respectively applying a data signal Dm (refer to FIG. 2) and the driving voltage ELVDD (refer to FIG. 2) and extending in a second direction (a y-direction) crossing the scan line 121, the previous scan line 122, the emission control line 123, the next scan line 124, and the initialization voltage line 134. Also, the pixel PX includes the TFTs T1 to T7, the storage capacitor Cst, and the OLED (refer to FIG. 2) electrically connected to the TFTs T1 to T7, the storage capacitor Cst. The pixel PX includes a shielding portion 106 preventing or reducing parasitic capacitance between the data line 171 and a node connection line 174 connecting the driving TFT T1 to the compensation TFT T3.

The shielding portion 106 is between the data line 171 and the node connection line 174 and may reduce crosstalk by reducing occurrence of the parasitic capacitance therebetween. The shielding portion 106 may include a shielding semiconductor layer 126 and a metallic shielding layer 186 overlapping the shielding semiconductor layer 126. A constant voltage is applied to the shielding portion 106. In an exemplary embodiment, the shielding portion 106 is connected to the initialization voltage line 134, and the initialization voltage of about −3.5 volts (V) may be applied to the shielding portion 106, for example.

Hereinafter, for convenience, a description is provided according to a stacking order.

Figure 4:
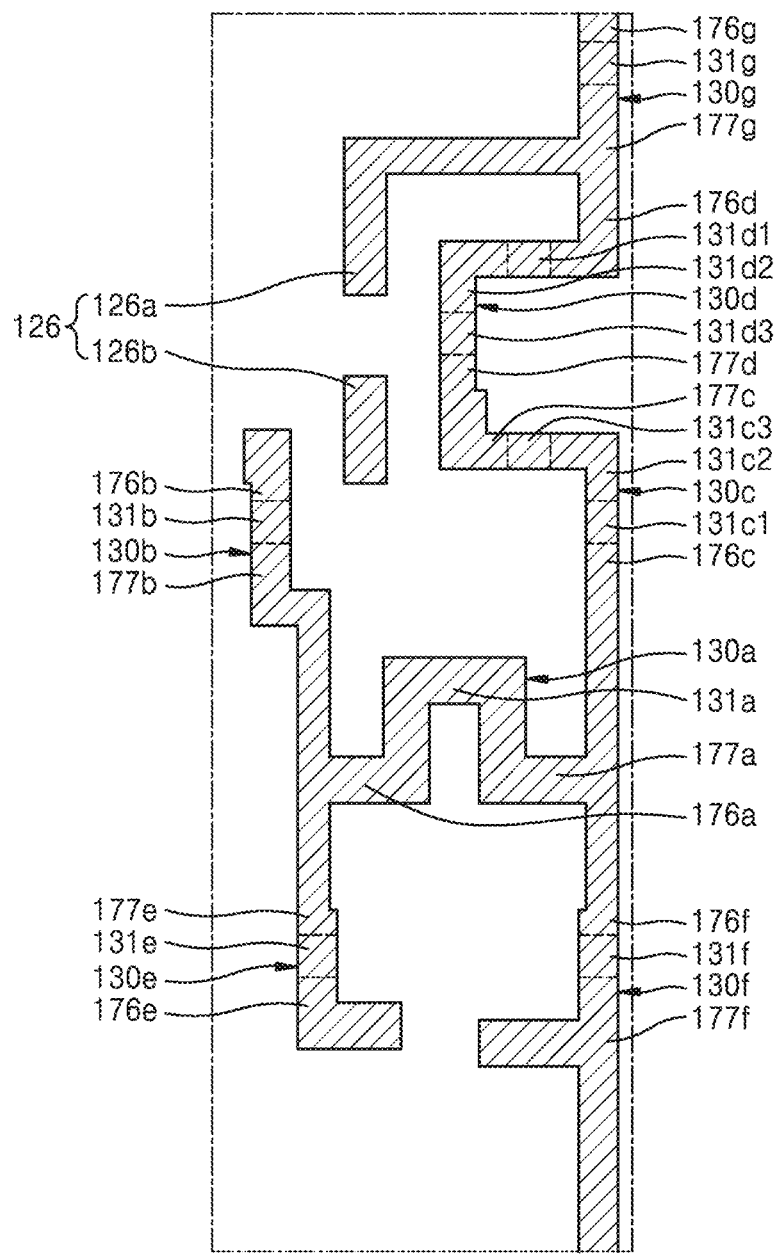
FIGS. 4 to 8 are plan views illustrating elements such as the plurality of TFTs, the storage capacitor, and the pixel electrode of FIG. 3 on a layer basis.

Referring to FIGS. 3, 4, and 9, semiconductor layers 130a to 130g respectively of the driving TFT T1, the switching TFT T2, the compensation TFT T3, the first initialization TFT T4, the operation control TFT T5, the emission control TFT T6, and the second initialization TFT T7 are in the same layer and include a same material.

The semiconductor layers 130a to 130g may be disposed over a buffer layer 111 on the substrate 110. In an exemplary embodiment, the substrate 110 may include a glass material, a metallic material, or a plastic material such as polyethylene terephthalate ("PET"), polyethylene naphthalate ("PEN"), or polyimide. In an exemplary embodiment, the buffer layer 111 may include an oxide layer such as SiOx and/or a nitride layer such as SiNx.

The driving semiconductor layer 130a of the driving TFT T1, the switching semiconductor layer 130b of the switching TFT T2, the compensation semiconductor layer 130c of the compensation TFT T3, the first initialization semiconductor layer 130d of the first initialization TFT T4, the operation control semiconductor layer 130e of the operation control TFT T5, the emission control semiconductor layer 130f of the emission control TFT T6, and the second initialization semiconductor layer 130g of the second initialization TFT T7 may be connected to each other and curved in various shapes.

The shielding semiconductor layer 126 may be between the data line 171 and the node connection line 174 and be arranged in the second direction. The shielding semiconductor layer 126 may include first and second shielding regions 126a and 126b arranged in the second direction and spaced apart from each other with the previous scan line 122 therebetween.

The first shielding region 126a may be connected to the first and second initialization semiconductor layers 130d and 130g, and the second shielding region 126b may extend between the switching semiconductor layer 130b and the compensation semiconductor layer 130c while spaced apart from the first shielding region 126a. Although the illustrated exemplary embodiment illustrates that the first shielding region 126a of the shielding semiconductor layer 126 is connected to the first and second initialization semiconductor layers 130d and 130g, the invention is not limited thereto. In another embodiment, the shielding semiconductor layer 126 may be an island type semiconductor layer not connected to the first and second initialization semiconductor layers 130d and 130g.

The shielding semiconductor layer 126 may be in a same layer as that in which the semiconductor layers 130a to 130g are arranged. In an exemplary embodiment, the shielding semiconductor layer 126 and the semiconductor layers 130a to 130g may include polycrystalline silicon. In alternative exemplary embodiment, the shielding semiconductor layer 126 and the semiconductor layers 130a to 130g may include amorphous silicon or an oxide semiconductor such as a G-I-Z-O layer ([(In$_2$O$_3$)$_a$(Ga$_2$O$_3$)$_b$(ZnO)$_c$ layer] (where each of a, b, and c are a real number satisfying a≥0, b≥0, and c≥0)). Hereinafter, for convenience of description, a case where the shielding semiconductor layer 126 and the semiconductor layers 130a to 130g include polycrystalline silicon is described.

The semiconductor layers 130a to 130g may include a channel region, and a source region may be at one side of the channel region and a drain region may be at another side of the channel region. In an exemplary embodiment, the semiconductor layers 130a to 130g may be doped with impurities by the scan line 121, the previous scan line 122, the emission control line 123, the next scan line 124, and the first electrode layer 125a, which will be described with reference to FIG. 5, as self-align masks, for example. Therefore, a source region and a drain region not overlapping the scan line 121, the previous scan line 122, the emission control line 123, the next scan line 124, and the first electrode layer 125a may include N-type or P-type impurities. While the source region and the drain region are doped with impurities, the shielding semiconductor layer 126 may be also doped with the same impurities as the impurities of the source and drain regions. The source and drain regions of the semiconductor layers 130a to 130g respectively correspond to source and drain electrodes. Hereinafter, the terms of a source region and a drain region are used instead of a source electrode and a drain electrode.

The driving semiconductor layer 130a includes a driving channel region 131a, and a driving source region 176a is disposed at one side of the driving channel region 131a and a driving drain region 177a is disposed at another side of the driving channel region 131a. The driving channel region 131a may be longer than channel regions 131b to 131g. In an exemplary embodiment, the driving semiconductor layer 130a has a shape curved by a plurality of number of times, such as an omega or a letter "S" shape, and thus may provide a long channel length inside a narrow space, for example. Since the driving channel region 131a has a long length, the driving range of a gate voltage applied to the first electrode layer 125a, which is a driving gate electrode, widens, and thus a gray scale of light emitted from the OLED may be more finely controlled and a display quality may improve.

The switching semiconductor layer 130b includes a switching channel region 131b, and a switching source region 176b is disposed at one side of the switching channel region 131b and a switching drain region 177b at another side of the switching channel region 131b. The switching drain region 177b is connected to the driving source region 176a.

The compensation semiconductor layer 130c includes compensation channel regions 131c1 and 131c3, and a compensation source region 176c is disposed at a side of the compensation channel region 131c1 and a compensation drain region 177c at a side of the compensation channel region 131c3. Compensation TFTs T3 in the compensation semiconductor layer 130c are dual TFTs and include the two compensation channel regions 131c1 and 131c3. A region 131c2 between the compensation channel regions 131c1 and 131c3 is a region doped with impurities and, locally, serves as a source region of one of the dual TFTs and simultaneously serves as a drain region of the other.

The first initialization semiconductor layer 130d includes first initialization channel regions 131d1 and 131d3, and a first initialization source region 176d is disposed at a side of the first initialization channel region 131d1 and a first initialization drain region 177d is disposed at a side of the first initialization channel region 131d3. First initialization TFTs T4 in the first initialization semiconductor layer 130d are dual TFTs and include the two first initialization channel regions 131d1 and 131d3. A region 131d2 between the first initialization channel regions 131d1 and 131d3 is a region doped with impurities and, locally, serves as a source region of one of the dual TFTs and simultaneously serves as a drain region of the other.

The operation control semiconductor layer 130e includes an operation control channel region 131e, and an operation control source region 176e is disposed at one side of the operation control channel region 131e and an operation control drain region 177e is disposed at another side of the operation control channel region 131e. The operation control drain region 177e may be connected to the driving source region 176a.

The emission control semiconductor layer 130f includes an emission control channel region 131f, and an emission control source region 176f is disposed at one side of the emission control channel region 131f and an emission control drain region 177f at another side of the emission control channel region 131f. The emission control source region 176f may be connected to the driving drain region 177a.

The second initialization semiconductor layer 130g includes a second initialization channel region 131g, and a second initialization source region 176g is disposed at one side of the second initialization channel region 131g and a second initialization drain region 177g at another side of the second initialization channel region 131g.

The first gate insulating layer 141 is disposed over the semiconductor layers 130a to 130g. The first gate insulating layer 141 may include an inorganic material including an oxide or a nitride. In an exemplary embodiment, the first gate insulating layer 141 may include SiO$_2$, SiNx, SiON, Al$_2$O$_3$, TiO$_2$, Ta$_2$O$_5$, HfO$_2$, or ZnO$_2$, for example.

Figure 5:
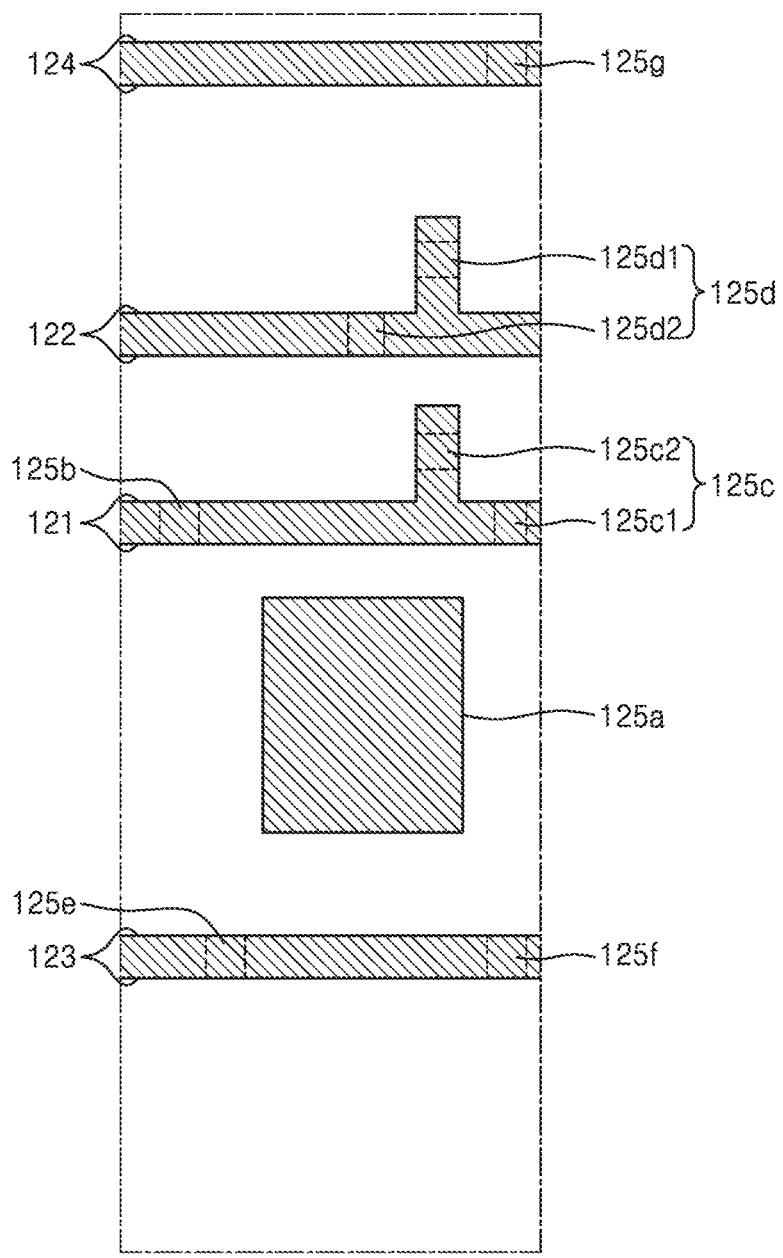

Referring to FIGS. 3, 5, and 9, the scan line 121, the previous scan line 122, the emission control line 123, the next scan line 124, and the first electrode layer 125a are disposed over the first gate insulating layer 141. The scan line 121, the previous scan line 122, the emission control line 123, and the first electrode layer 125a include the same material. In an exemplary embodiment, the scan line 121, the previous scan line 122, the emission control line 123, and the first electrode layer 125a may include a single layer or a multi-layer including Mo, Al, Cu, Ti, etc., for example.

A portion or protruding portion of each of the scan line 121, the previous scan line 122, the emission control line 123, the next scan line 124, and the first electrode layer 125a corresponds to the gate electrode of the TFTs T1 to T7.

Regions of the scan line 121 overlapping the switching channel region 131b and the compensation channel regions 131c1 and 131c3 respectively correspond to a switching gate electrode 125b and compensation gate electrodes 125c1 and 125c2. Regions of the previous scan line 122 overlapping the first initialization channel regions 131d1 and 131d3 respectively correspond to first initialization gate electrodes 125d1 and 125d2 providing the first initialization gate electrodes 125d. Regions of the emission control line 123 overlapping the operation control channel region 131e and the emission control channel region 125f respectively correspond to an operation control gate electrode 125e and an emission control gate electrode 125f. Regions of the next scan line 124 overlapping the second initialization channel region 131g corresponds to a second initialization gate electrode 125g.

Compensation gate electrodes 125c are dual gate electrodes including the first and second compensation gate electrodes 125c1 and 125c2 and may prevent or reduce occurrence of a leakage current.

A portion of the first electrode layer 125a overlapping the driving channel region 131a corresponds to the driving gate electrode G1. The first electrode layer 125a serves as the driving gate electrode G1 and simultaneously serves as the first storage capacitor plate C1 of the storage capacitor Cst. That is, the driving gate electrode G1 and the first storage capacitor plate C1 may be understood to be one body.

The second gate insulating layer 143 is disposed over the scan line 121, the previous scan line 122, the emission control line 123, the next scan line 124, and the first electrode layer 125a. The second gate insulating layer 143 may include an inorganic material including an oxide or a nitride. In an exemplary embodiment, the second gate insulating layer 143 may include $SiO_2$, SiNx, SiON, $Al_2O_3$, $TiO_2$, $Ta_2O_5$, $HfO_2$, or $ZnO_2$, for example.

Figure 6:
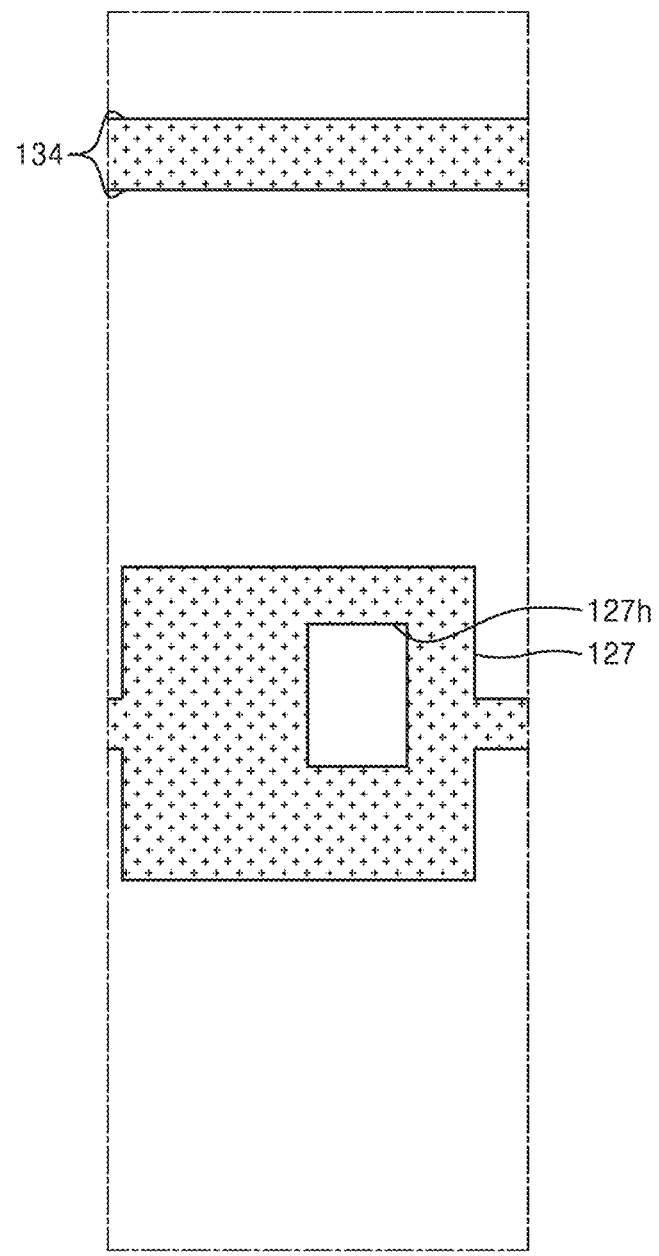

Referring to FIGS. 3, 6, and 9, the initialization voltage line 134 and a second electrode layer 127 are disposed over the second gate insulating layer 143. The initialization voltage line 134 and the second electrode layer 127 include a same material. In an exemplary embodiment, the initialization voltage line 134 and the second electrode layer 127 may include a single layer or a multi-layer including Mo, Al, Cu, Ti, etc., for example.

The initialization voltage line 134 transfers the initialization voltage VINT (refer to FIG. 2) initializing the driving TFT T1 and a pixel electrode 210. The initialization voltage line 134 is electrically connected to the first initialization source electrode 176d and the second initialization drain electrode 177g. In an exemplary embodiment, the initialization voltage line 134 may be electrically connected to the first initialization source electrode 176d and the second initialization drain electrode 177g via the metallic shielding layer 186, for example.

The second electrode layer 127 overlaps the first electrode layer 125a with the second gate insulating layer 143 therebetween. The second electrode layer 127 corresponds to the second storage capacitor plate C2 (refer to FIG. 2) of the storage capacitor Cst. An opening 127h exposing the first electrode layer 125a may be defined in the second electrode layer 127. One end of the node connection line 174 is connected to the first electrode layer 125a via the opening 127h.

An interlayer insulating layer 150 is disposed over the initialization voltage line 134 and the second electrode layer 127. In an exemplary embodiment, the interlayer insulating layer 150 may include $SiO_2$, SiNx, SiON, $Al_2O_3$, $TiO_2$, $Ta_2O_5$, $HfO_2$, or $ZnO_2$, for example.

Referring to FIGS. 3, 7, and 9, the data line 171, the driving voltage line 172, the node connection line 174, an intermediate connection line 175, and the metallic shielding layer 186 are disposed over the interlayer insulating layer 150. The data line 171, the driving voltage line 172, the node connection line 174, the intermediate connection line 175, and the metallic shielding layer 186 are in a same layer and include a same material.

In an exemplary embodiment, the data line 171, the driving voltage line 172, the node connection line 174, the intermediate connection line 175, and the metallic shielding layer 186 may include a single layer or a multi-layer including a conductive material including Mo, Al, Cu, Ti, etc., for example. In an exemplary embodiment, the data line 171, the driving voltage line 172, the node connection line 174, the intermediate connection line 175, and the metallic shielding layer 186 may include a multi-layered structure of Ti/Al/Ti, for example.

The data line 171 extends in the second direction and is connected to the switching source region 176b of the switching TFT T2 via a contact hole 151 passing through the interlayer insulating layer 150.

The driving voltage line 172 extends in the second direction and is connected to the operation source region 176e of the operation control TFT T5 and the second electrode layer 127 via contact holes 152 and 153 defined in the interlayer insulating layer 150.

The driving voltage line 172 covers at least a portion of the compensation TFT T3 and may prevent or reduce occurrence of an off-current caused by external light. In an exemplary embodiment, the driving voltage line 172 may cover a region exposed between the compensation gate electrodes 125c1 and 125c2, which are dual gate electrodes, that is, a region 131c2 between the compensation channel regions 131c1 and 131c3. In an exemplary embodiment, the driving voltage line 172 may cover at least a portion of a region of the compensation TFT T3 including the dual gate electrodes adjacent to the node connection line 174, for example.

When the driving voltage line 172 does not cover the compensation TFT T3, an off-current caused by external light increases, and a leakage current is introduced to the driving TFT T1 such that color deviation may occur. However, according to an exemplary embodiment, since the driving voltage line 172 covers at least a portion of the compensation TFT T3, color deviation by a leakage current may be prevented or reduced.

The node connection line 174 connects the first electrode layer 125a to the compensation drain region 177c of the compensation TFT T3 via contact holes 154 and 155. The island type first electrode layer 125a may be electrically connected to the compensation TFT T3 by the node connection line 174.

The intermediate connection layer 175 is connected to the emission control TFT T6 via a contact hole 156. In an exemplary embodiment, the intermediate connection line 175 may be connected to the emission control drain region 177f of the emission control TFT T6, for example.

Via contact holes 158 and 159, the metallic shielding layer 186 electrically connects the first and second shielding regions 126a and 126b spaced apart from each other. Although the metallic shielding layer 186 may be connected to the initialization voltage line 134 via a contact hole 157, the invention is not limited thereto.

The planarization insulating layer 160 may be over the data line 171, the driving voltage line 172, the node connection line 174, the intermediate connection layer 175, and the metallic shielding layer 186. In an exemplary embodiment, the planarization insulating layer 160 may include an organic material such as acryl, benzocyclobutene ("BCB"), polyimide, or hexamethyldisiloxane ("HMDSO").

Referring to FIGS. 3, 8, and 9, the pixel electrode 210 may be on the planarization insulating layer 160. The pixel electrode 210 is connected to the intermediate connection layer 175 via a contact hole 165 defined in the planarization insulating layer 160. The pixel electrode 210 is connected to the emission control drain region 177f of the emission control TFT T6 by the intermediate connection layer 175.

The pixel electrode 210 may be a reflective electrode. In an exemplary embodiment, the pixel electrode 210 may include a reflective layer including Ag, Mg, Al, Pt, Pd, Au, Ni, Nd, Ir, Cr, or a combination thereof, and a transparent or semi-transparent electrode layer over the reflective layer, for example. In an exemplary embodiment, the transparent or semi-transparent electrode layer may include at least one of indium tin oxide ("ITO"), indium zinc oxide ("IZO"), zinc oxide ("ZnO"), $In_2O_3$, indium gallium oxide ("IGO"), and aluminum zinc oxide ("AZO"), for example.

Though not shown, a pixel-defining layer exposing the pixel electrode 210 is disposed over the pixel electrode 210, and an emission layer 220 is on the pixel electrode 210 exposed by the pixel-defining layer. In an exemplary embodiment, the emission layer 220 may include an organic material including a fluorescent or phosphorescent material emitting red, green, blue, or white light, for example. The emission layer 220 may include a low molecular organic material or a polymer organic material. A functional layer such as a hole transport layer ("HTL"), a hole injection layer ("HIL"), an electron transport layer ("ETL"), and an electron injection layer ("EIL") may be selectively further arranged over and below the emission layer 220.

An opposite electrode 230 may be a transparent electrode. In an exemplary embodiment, the opposite electrode 230 may be a transparent or semi-transparent electrode and may include a thin metallic layer having a small work function including Li, Ca, LiF/Ca, LiF/Al, Al, Ag, Mg, or a combination thereof, for example. In an exemplary embodiment, a transparent conductive oxide ("TCO") such as ITO, IZO, ZnO, or $In_2O_3$ may be further arranged over the thin metallic layer.

As illustrated in FIG. 3, in the case where the driving voltage line 172 covers at least a portion of the compensation TFT T3, a predetermined gap is provided between the data line 171 and the node connection line 174 connected to the first electrode layer 125a which is the driving gate electrode G1 of the driving TFT T1. The shielding portion 106 is in the gap between the data line 171 and the node connection line 174, may block parasitic capacitance generated between the data line 171 and the first electrode layer 125a which is the driving gate electrode G1, by a signal change of the data line 171, and may prevent or reduce occurrence of crosstalk resulting from the parasitic capacitance.

As illustrated in FIGS. 3 and 9, the shielding portion 106 may include the shielding semiconductor layer 126 and the metallic shielding layer 186. In this case, the first shielding region 126a and the second shielding region 126b of the shielding semiconductor layer 126 may be electrically connected to each other by the metallic shielding layer 186 which is a conductive layer, and may be electrically connected to the initialization voltage line 134. The shielding semiconductor layer 126 and the metallic shielding layer 186 of the shielding portion 106 may respectively block parasitic capacitance in a horizontal direction and parasitic capacitance in a vertical direction between the data line 171, the node connection line 174, and the semiconductor layers 130b and 130c connected thereto.

According to the exemplary embodiments illustrated in FIGS. 3 to 9, although the structure in which the shielding semiconductor layer 126 is electrically connected to the initialization voltage line 134 by the metallic shielding layer 186 has been described, the invention is not limited thereto. In another exemplary embodiment, the shielding semiconductor layer 126 (e.g. first shielding region 126a) may be directly connected to the initialization voltage line 134 via contact holes passing through insulating layers between the initialization voltage line 134 and the shielding semiconductor layer 126, that is, the first and second gate insulating layers 141 and 143.

FIGS. 10 to 14 are plan views of a structure of a pixel PX according to another exemplary embodiment. Except for shielding portions 206, 306, 406, 506, and 606, the structure of the pixel PX of FIGS. 10 to 14 is substantially the same as that of the pixel PX described above with reference to FIG. 3, and thus differences therefrom are mainly described below for convenience of description.

Figure 10:
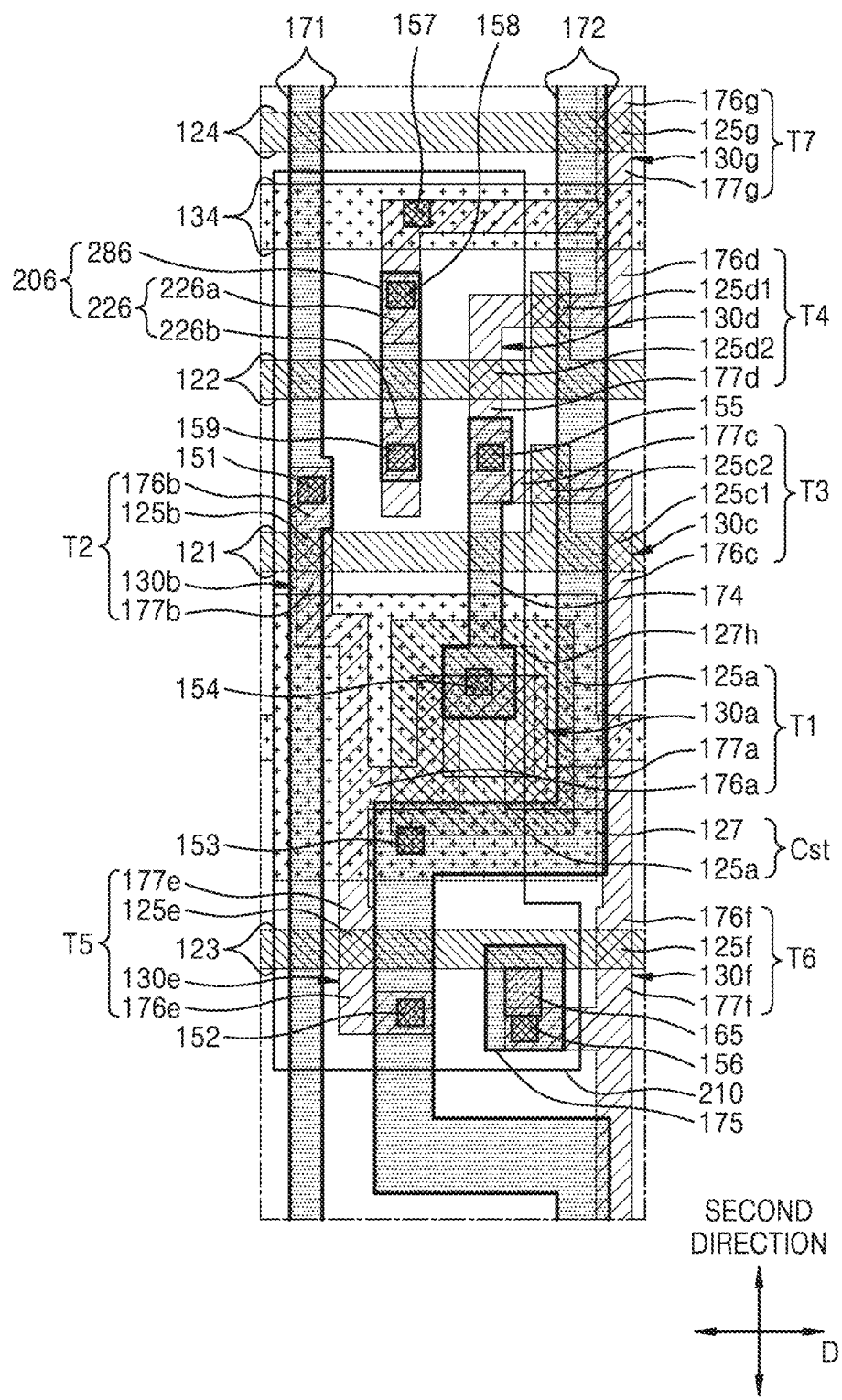
FIGS. 10 to 14 are plan views of another exemplary embodiment of a structure of a pixel.

Referring to FIG. 10, the shielding portion 206 includes a shielding semiconductor layer 226. The shielding semiconductor layer 226 may include a first shielding region 226a and a second shielding region 226b spaced apart from each other in the second direction. The shielding semiconductor layer 226 may include the same material as that of the above-described shielding semiconductor layer 126 (refer to FIG. 3).

The first shielding region 226a may be connected to the initialization voltage line 134 via a contact hole 147 and may be electrically connected to the second shielding region 226b via a metallic shielding layer 286 which is a conductive layer.

Although FIGS. 3 and 10 illustrate the shielding semiconductor layers 126 and 226 having a structure in which the first and second shielding regions 126a and 226a, and the second shielding regions 126b and 226b are spaced apart from each other with the previous scan line 122 therebetween, the invention is not limited thereto.

Figure 11:
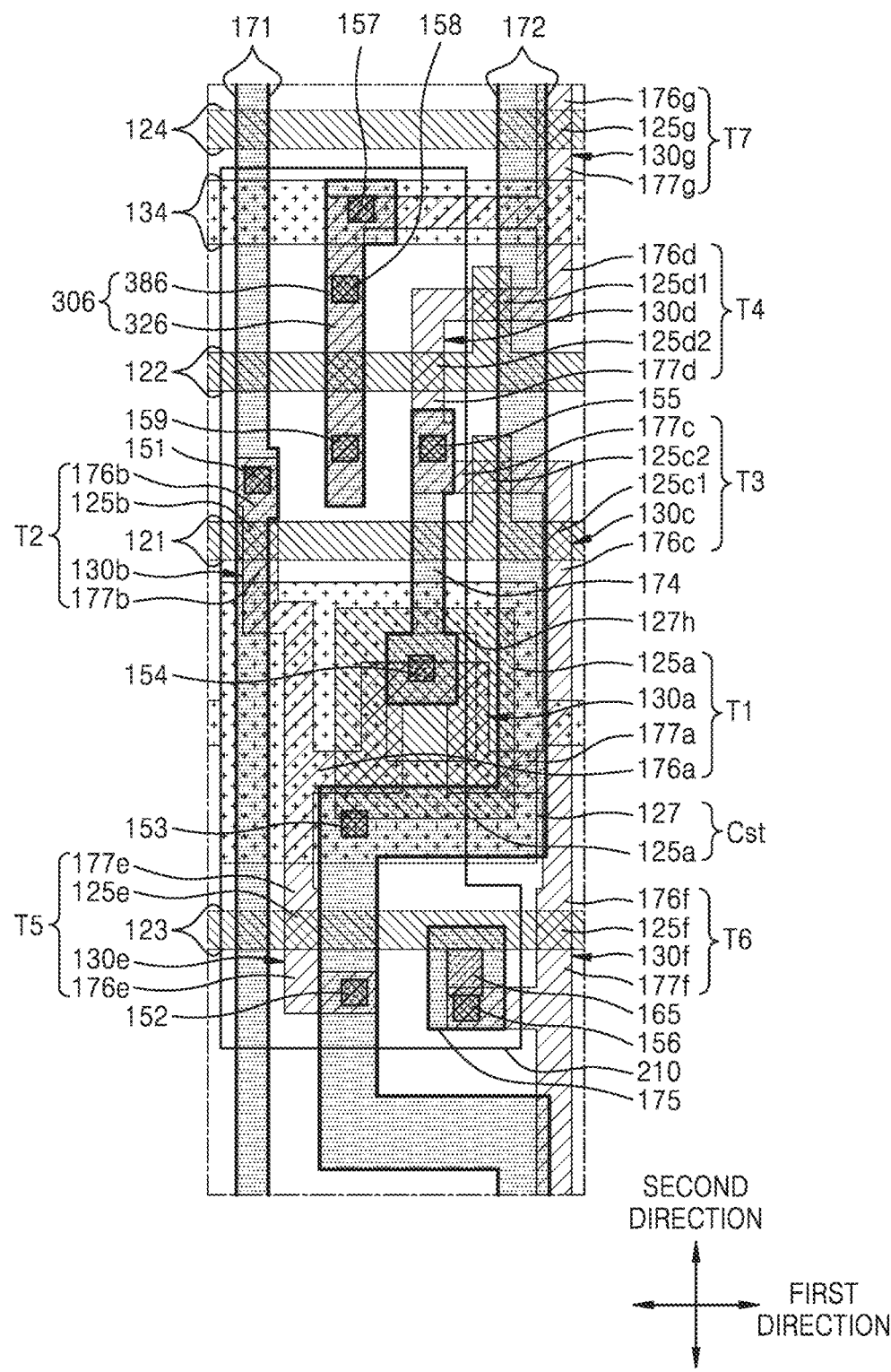

Referring to FIG. 11, the shielding portion 306 includes a shielding semiconductor layer 326 and a metallic shielding layer 386. The shielding semiconductor layer 326 may overlap and cross a portion of the previous scan line 122 and extend in the second direction.

In the case where the shielding semiconductor layer 326 overlaps a portion of the previous scan line 122 as illustrated in FIG. 11, an unexpected TFT may be disposed in which the overlapping region of the shielding semiconductor layer 326 and the previous scan line 122 becomes a channel region during a process of doping the first initialization semiconductor layer 130d using the previous scan line 122 as a mask for providing the first initialization source and drain regions 176d and 177d. To prevent the aforementioned phenomenon, as described with reference to FIGS. 3 and 10, the shielding semiconductor layers 126 and 226 including the first shielding regions 126a and 226a and the second shielding regions 126b and 226b spaced apart from each other with the previous scan line 122 therebetween may be disposed. However, in a case where an operation of the unexpected TFT is ignorable or, unlike FIG. 11, the previous scan line 122 does not cross the shielding semiconductor layer 326, the shielding semiconductor layer 326 may extend in the second direction as illustrated in FIG. 11.

Although FIG. 11 illustrates that the shielding portion 306 includes a double layer including the shielding semiconductor layer 326 and the metallic shielding layer 386, the invention is not limited thereto.

Figure 12:
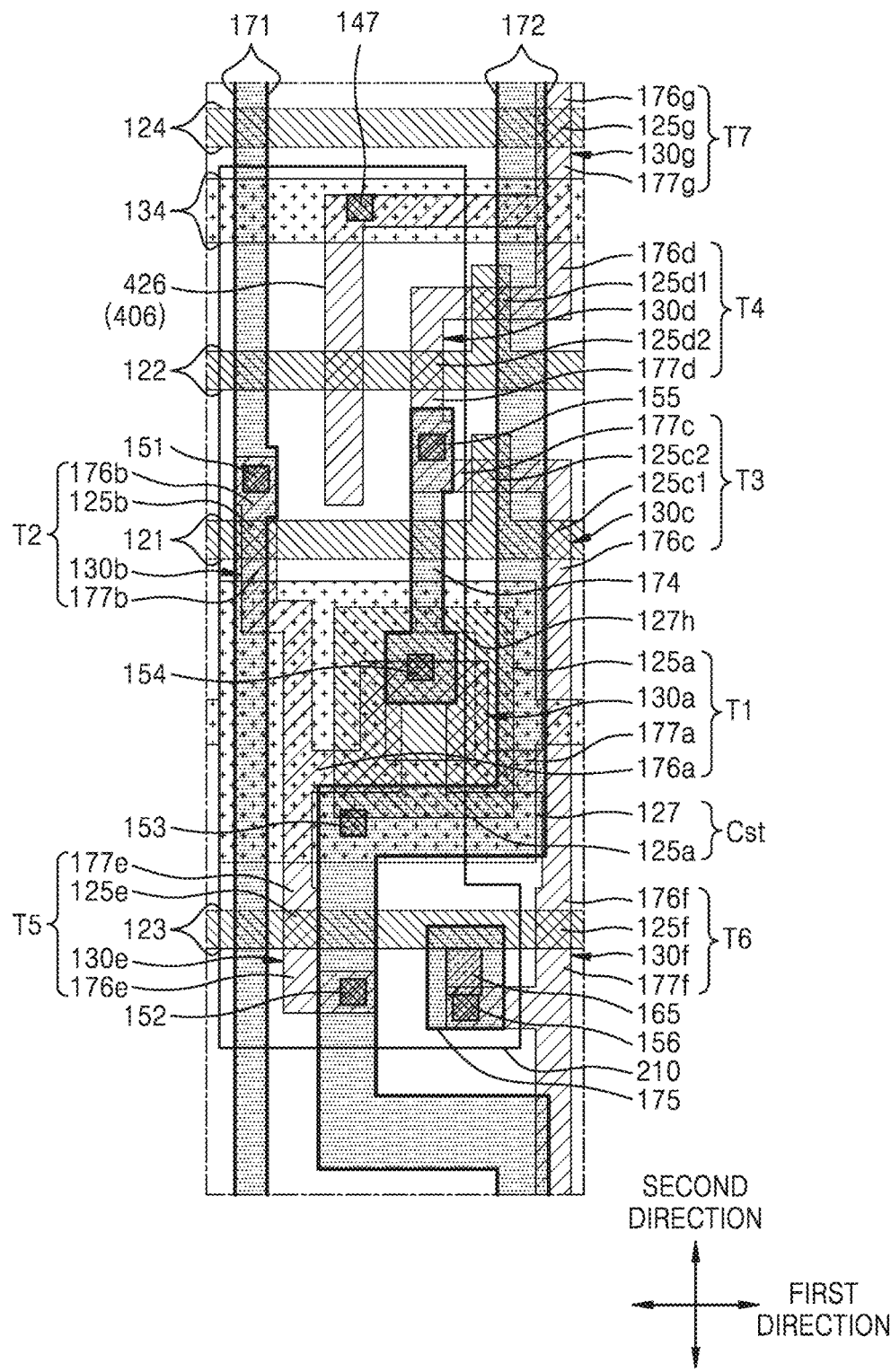

Referring to FIG. 12, the shielding portion 406 may include a single layer including a shielding semiconductor layer 426. The shielding semiconductor layer 426 may be connected to the initialization voltage line 134 via the contact hole 147 defined in an insulating layer between the shielding semiconductor layer 426 and the initialization voltage line 134 and may receive a constant voltage.

Although the above exemplary embodiments have described a case where the shielding portions 106, 206, 306, and 406 include a layer including a semiconductor material, the exemplary embodiments are not limited thereto. In another exemplary embodiment, the shielding portions may only include a layer including a metallic material.

Figure 13:
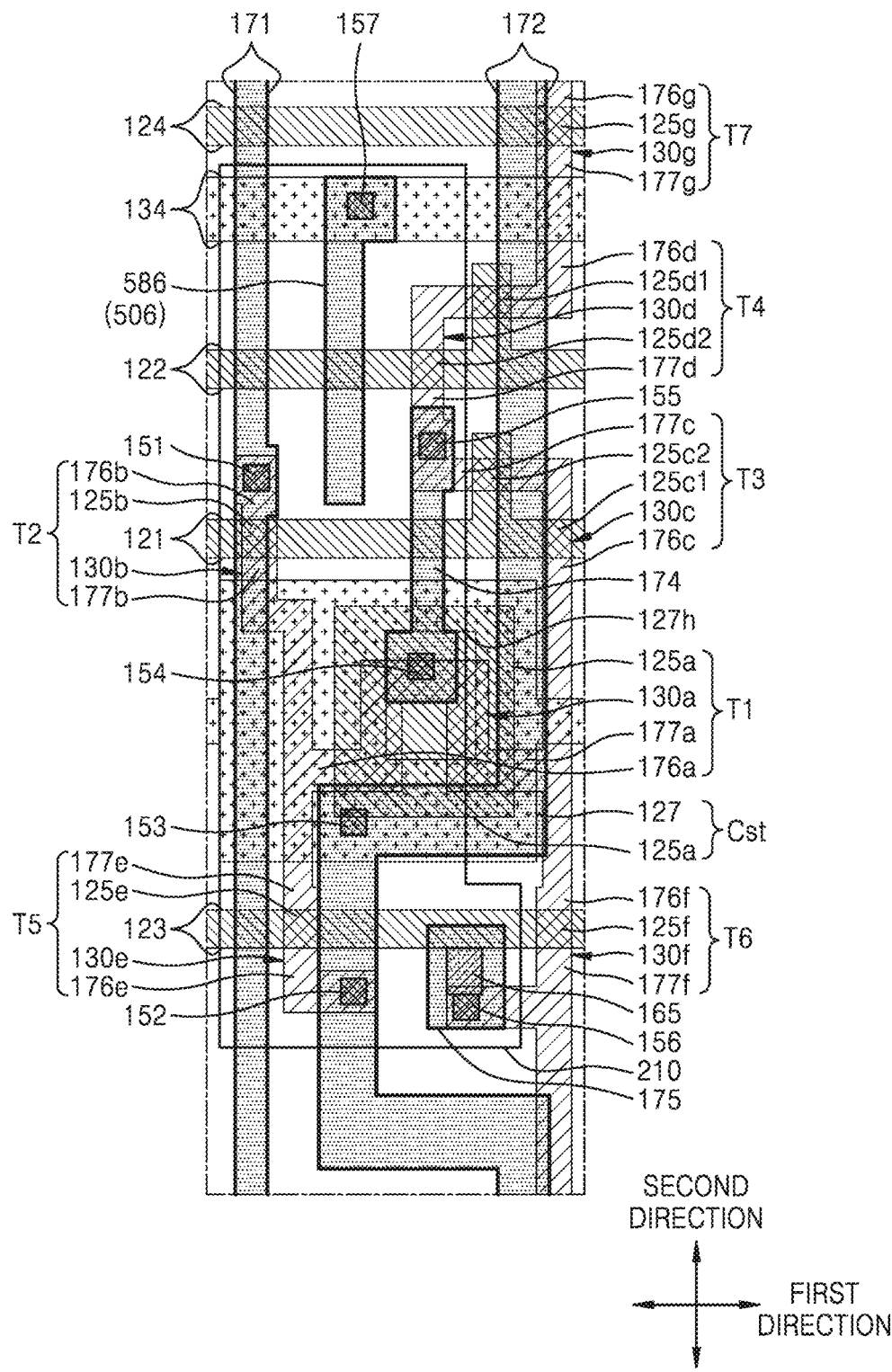

Referring to FIG. 13, the shielding portion 506 may include a single metallic shielding layer 586. The single metallic shielding layer 586 may include the same material as that of the metallic shielding layer 186 described above with reference to FIG. 3.

Figure 14:
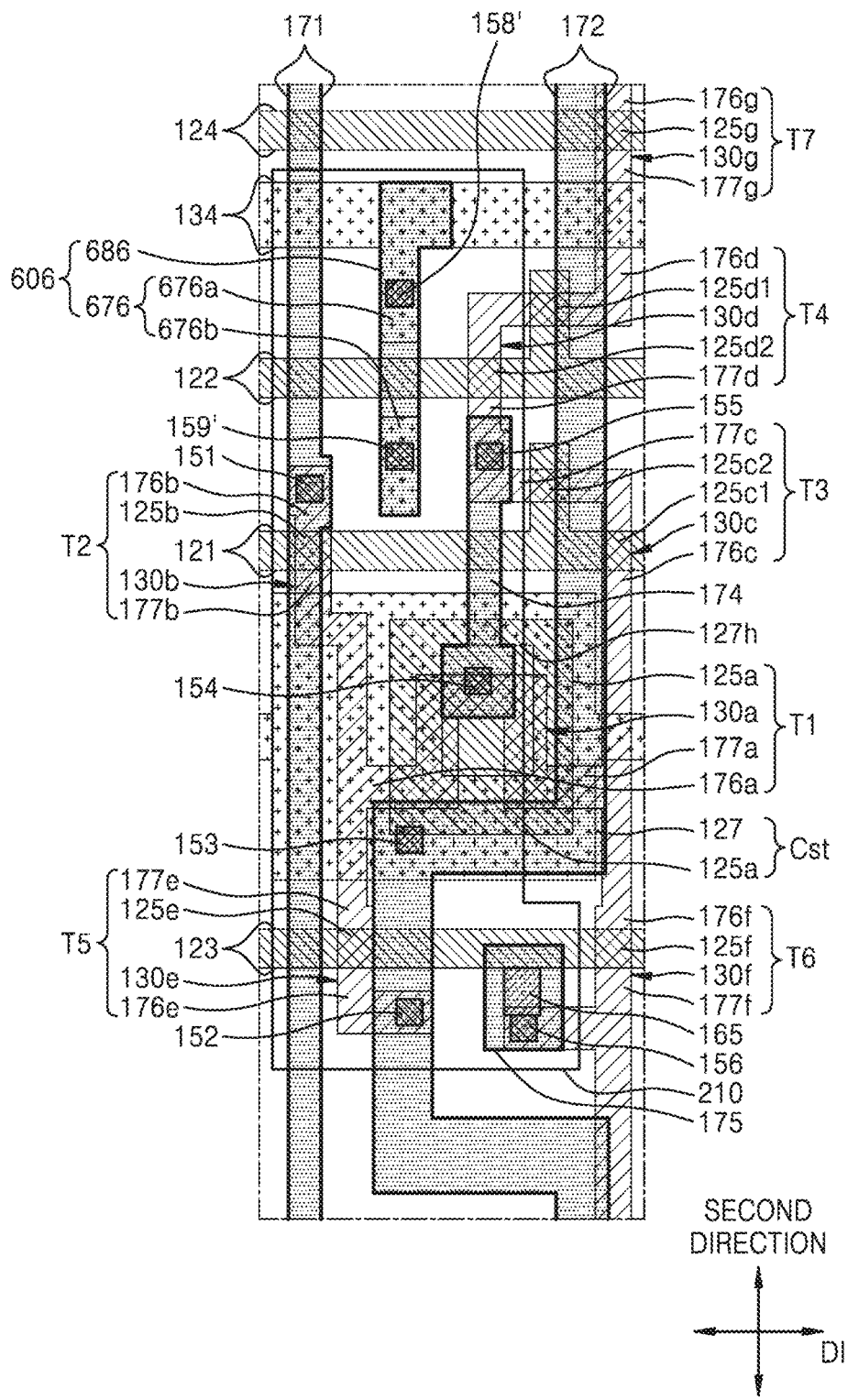

Referring to FIG. 14, the shielding portion 606 may include a double layer including a first metallic shielding layer 676 and a second metallic shielding layer 686. The first metallic shielding layer 676 may be in the same layer in which the initialization voltage line 134 is arranged and may include the same material as that of the initialization voltage line 134. In an exemplary embodiment, the first metallic shielding layer 676 may include a first shielding region 676a partially protruding from the initialization voltage line 134 and a second shielding region 676b spaced apart from the first shielding region 676a and extending in the second direction, for example.

The second metallic shielding layer 686 may be in the same layer in which the above-described metallic shielding layer 186 (refer to FIG. 3) is arranged, may include the same material as that of the metallic shielding layer 186, and may be connected to the first shielding region 676a and the second shielding region 676b via contact holes 158' and 159', respectively.

Hereinafter, Table 1 shows parasitic capacitance Cgk between the data line 171 and the node connection line 174 connected to the gate electrode layer 125a of the driving TFT T1 by the shielding portion according to exemplary embodiments.

TABLE 1

|  | Comparative example | Embodiment 1 | Embodiment 2 | Embodiment 3 | Embodiment 4 |
|---|---|---|---|---|---|
| Cgk ($\times 10^{-15}$ F) | 0.152 | 0.1243 | 0.1296 | 0.1487 | 0.1401 |

The comparative example represents a case where a shielding portion is not provided between the data line 171 and the node connection line 174, the embodiment 1 represents a case where the shielding portion 106 illustrated in FIG. 3 is provided, the embodiment 2 represents a case where the shielding portion 406 illustrated in FIG. 12 is provided, the embodiment 3 represents a case where the shielding portion 506 illustrated in FIG. 13 is provided, and the embodiment 4 represents a case where the shielding portion 606 illustrated in FIG. 14 is provided.

Referring to Table 1, since the shielding portion is provided, parasitic capacitance between the data line 171 and the node connection line 174 is reduced, and particularly, in the case where the shielding portion includes a layer including a semiconductor material (the embodiments 1 and 2), the parasitic capacitance has been remarkably reduced. This is understood as resulting from an influence of the parasitic capacitance in a horizontal direction between the semiconductor layers 130b and 130c respectively connected to the data line 171 and the node connection line 174 being relatively greater than an influence of parasitic capacitance in the horizontal direction between the data line 171 and the node connection line 174 in the same layer. That is, since the compensation semiconductor layer 130c is directly connected to the driving semiconductor layer 130a of the driving TFT T1, the parasitic capacitance in the horizontal direction between the semiconductor layers 130b and 130c has a relatively great influence on an operation of the driving TFT T1. Therefore, the shielding portion may include the shielding semiconductor layer for effectively preventing the parasitic capacitance.

Though the invention has been described with reference to the exemplary embodiments illustrated in the drawings, this is merely provided as an example and it will be understood by those of ordinary skill in the art that various changes in form and details and equivalents thereof may be made therein without departing from the spirit and scope of the invention as defined by the following claims.

What is claimed is:

1. A display device comprising:
a first scan line extending in a first direction;
a second scan line extending in the first direction;
a first voltage line extending in the first direction;
a plurality of data lines extending in a second direction crossing the first direction;
a first transistor electrically connected to the first scan line and a first data line of the plurality of data lines;
a second transistor electrically connected to the first transistor;
a third transistor electrically connected to the first scan line and the second transistor;
a fourth transistor electrically connected to the second scan line;
a metallic layer electrically connected to the first voltage line and extending away from the first voltage line, wherein the metallic layer crosses the second scan line; and
a driving voltage line extending in the second direction, wherein the driving voltage line at least partially overlaps a semiconductor layer of the third transistor.

2. The display device of claim 1, wherein a portion of the metallic layer that crosses the second scan line is located between a first end portion and a second end portion of the metallic layer.

3. The display device of claim 2, further comprising a first insulating layer that is disposed between the first voltage line and the metallic layer, wherein the first end portion of the metallic layer contacts the first voltage line via a first contact hole in the first insulating layer.

4. The display device of claim 3, wherein the second end portion of the metallic layer contacts a semiconductor region via a second contact hole in the first insulating layer, and wherein the semiconductor region is connected to a semiconductor layer of the fourth transistor.

5. The display device of claim 4, further comprising at least one insulating layer that is disposed between the first insulating layer and the semiconductor region, and wherein the second contact hole passes through the at least one insulating layer.

6. The display device of claim 1, wherein the second scan line is between the first voltage line and the first scan line.

7. A display device, comprising:
a first scan line extending in a first direction;
a second scan line extending in the first direction;
a first voltage line extending in the first direction;
a plurality of data lines extending in a second direction crossing the first direction;
a first transistor electrically connected to the first scan line and a first data line of the plurality of data lines;
a second transistor electrically connected to the first transistor;
a third transistor electrically connected to the first scan line and the second transistor;
a fourth transistor electrically connected to the second scan line;

a metallic layer electrically connected to the first voltage line and extending away from the first voltage line;
a node connection line connecting the second transistor to the third transistor; and
a driving voltage line extending in the second direction, wherein the driving voltage line at least partially overlaps a semiconductor layer of the third transistor.

8. The display device of claim 7, wherein the node connection line crosses the first scan line.

9. The display device of claim 7, wherein the semiconductor layer of the third transistor comprises a source region, a channel region, and a drain region, and
wherein a first end portion of the node connection line contacts a semiconductor region connected to one of the source region and the drain region of the third transistor.

10. The display device of claim 9, wherein the second transistor comprises a semiconductor layer and a gate electrode, and
wherein the second end of the node connection line contacts a gate electrode of the second transistor.

11. The display device of claim 7, wherein the node connection line is located between two adjacent data lines of the plurality of data lines.

12. The display device of claim 11, wherein the node connection line extends along a virtual line in the second direction, and
wherein the metallic layer is between the virtual line and one of the two adjacent data lines.

13. The display device of claim 7, wherein the metallic layer comprises same metal material as the first date line or the node connection line.

14. The display device of claim 1, wherein the second scan line is between the first voltage line and the first scan line.

15. A display device comprising:
a first scan line extending in a first direction;
a second scan line extending in the first direction;
an initial voltage line extending in the first direction;
a plurality of data lines each extending in a second direction crossing the first direction;
a plurality of driving voltage lines each extending in the second direction;
a switching thin film transistor connected to the first scan line and one of the plurality of data lines;
a driving thin film transistor connected to the switching thin film transistor and comprising:
a driving semiconductor layer; and
a driving gate electrode;
a storage capacitor connected to the driving thin film transistor and comprising first and second storage capacitor plates;
a first thin film transistor electrically connected to the first scan line and the driving thin film transistor;
a node connection line connected to the driving gate electrode, the node connection line connecting the driving thin film transistor to the first thin film transistor;
a second thin film transistor electrically connected to the second scan line and the initial voltage line; and
a metallic layer between neighboring data lines of the plurality of data lines and electrically connected to the initial voltage line,
wherein the driving semiconductor layer of the driving thin film transistor, a switching semiconductor layer of the switching thin film transistor, a first semiconductor layer of the first thin film transistor, and a second semiconductor layer of the second thin film transistor are integrally formed with each other, and
the plurality of driving voltage lines comprises a first driving voltage line that at least partially overlaps a semiconductor layer of the first thin film transistor.

16. The display device of claim 14, wherein the metallic layer and the node connection line comprises a same material.

17. The display device of claim 14, wherein the metallic layer is located between a first virtual line and a second virtual line, wherein one of the neighboring data lines extends along the first virtual line and the node connection line extends along the second virtual line in a plan view.

18. The display device of claim 15, wherein the first driving voltage line of the plurality of driving voltage lines is connected to the second storage capacitor plate.

19. The display device of claim 14, wherein the driving gate electrode comprises the first storage capacitor plate.

20. The display device of claim 14, further comprises a third thin film transistor electrically connected to the initial voltage line, wherein a third semiconductor layer of the third thin film transistor is integrally formed with the second semiconductor layer of the second thin film transistor.

21. A display device comprising:
a first scan line extending in a first direction;
a second scan line extending in the first direction;
a first voltage line extending in the first direction;
a plurality of data lines extending in a second direction crossing the first direction;
a first transistor electrically connected to the first scan line and a first data line of the plurality of data lines;
a second transistor electrically connected to the first transistor;
a third transistor electrically connected to the first scan line and the second transistor;
a fourth transistor electrically connected to the second scan line; and
a metallic layer electrically connected to the first voltage line and extending away from the first voltage line, wherein the metallic layer crosses the second scan line,
wherein the third transistor comprises a semiconductor layer overlapped by a portion of a conductive line.

22. The display device of claim 21, wherein the conductive line comprises a driving voltage line that extends in the second direction.

23. The display device of claim 22, wherein the driving voltage line is configured to transfer a driving voltage to the second transistor.

* * * * *